United States Patent [19]

Maguire

[11] Patent Number: 5,796,993
[45] Date of Patent: Aug. 18, 1998

[54] METHOD AND APPARATUS FOR SEMICONDUCTOR DEVICE OPTIMIZATION USING ON-CHIP VERIFICATION

[76] Inventor: Jeffrey E. Maguire, 2207 Rabb Glen St., Austin, Tex. 78704

[21] Appl. No.: 740,456

[22] Filed: Oct. 29, 1996

[51] Int. Cl.$^6$ .................................................. G06F 15/00
[52] U.S. Cl. ........................................... 395/555; 364/490
[58] Field of Search ............................... 395/555, 558; 364/488–490, 550, 551.01, 569

[56] References Cited

U.S. PATENT DOCUMENTS

| | | | |
|---|---|---|---|
| 4,855,969 | 8/1989 | Mydill | 368/120 |
| 5,475,605 | 12/1995 | Lin | 364/488 |
| 5,572,717 | 11/1996 | Pedersen | 395/555 |
| 5,629,859 | 5/1997 | Agarwala et al. | 364/489 |
| 5,751,593 | 5/1998 | Pullela et al. | 364/488 |

*Primary Examiner*—Thomas M. Heckler
*Attorney, Agent, or Firm*—J. Gustav Larson

[57] ABSTRACT

An on-chip optimization circuitry (105) of a semiconductor device (100) provides a delay value to a delay generator (120) indicating an amount to delay an active signal edge. Based on the delay value, a modified device timing is created. Using the modified device timing, a portion of the semiconductor device (130) is tested using on-chip verification circuitry (110) to determine functionality. Based on functionality, a determination is made whether an optimal delay value has been found (550). If an optimal delay value has not been determined, a new delay value is used to produce a new modified device timing (516) and the sequence of testing and determining functionality is repeated until a optimized value has been determined.

27 Claims, 6 Drawing Sheets

5,796,993

METHOD AND APPARATUS FOR SEMICONDUCTOR DEVICE OPTIMIZATION USING ON-CHIP VERIFICATION

FIELD OF THE INVENTION

Generally, the present invention relates to the testing of semiconductor devices, and specifically to the optimization of semiconductor devices using on-chip verification circuitry.

BACKGROUND OF THE INVENTION

Modern semiconductor devices, such as microprocessors, micro-controllers, and memories, are controlled by timing signals. Timing signals are generally based upon an external clock signal received by the device. Generally, events within a given device are controlled by rising and/or falling edges of a timing signal. In addition, device performance is often limited based on edge triggered events. For example, a latch associated with a data path of a device may have a specific "set-up" time between a timing signal and a data path. In order for functionality of the device to be assured, the setup time must be realized.

Because semiconductor device performance varies with process, temperature, and voltage variations, it is necessary for semiconductor suppliers to specify a margin to guarantee functionality across possible device conditions. These margins result in optimum semiconductor device performance not being met in terms of performance and power consumption. For example, it is common to specify a clock frequency, from which timing signals are generated, that is slow enough to assure operation in a worst case environment. This limits device performance where normal operating conditions occur. In turn, limiting device performance of devices limits performance of the systems which use them.

Therefore, it would be desirable to improve the overall performance of semiconductor devices.

DETAILED DESCRIPTION OF THE DRAWINGS

In operation, an on-chip optimization circuitry receives or generates a delay value indicating an amount to delay an active edge of a timing signal edge. Based on this delay value, a modified device timing is created by varying the active edge of the timing signal. Using the modified device timing, the device is tested using on-chip verification circuitry to determine functionality. Based on this test, a determination is made whether an optimal delay value has been found. If an optimal delay value has not been determined, a new delay value is used to produce a new modified device timing. The sequence of testing and determining functionality is repeated until an optimal value has been determined.

Figure 1:
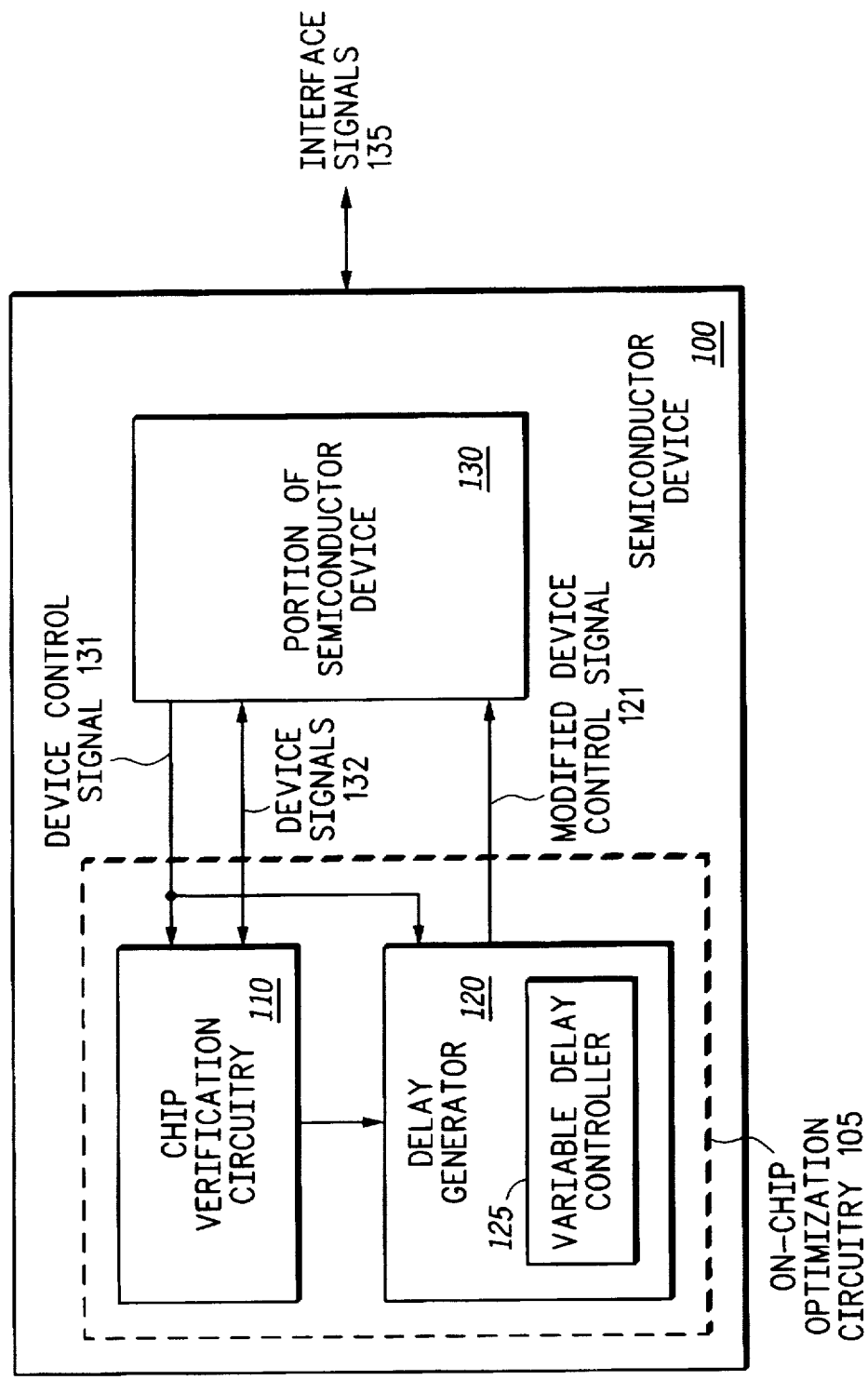
FIG. 1 illustrates, in block diagram form, a device 100 in accordance with the present invention.

FIG. 1 illustrates, in block diagram form, a semiconductor device 100 in accordance with the present invention. The semiconductor device 100 further comprises on-chip optimization circuitry 105, and a portion of the semiconductor device 130. The chip optimization circuitry 105 is coupled to the portion of semiconductor device 130.

In operation, the on-chip optimization circuitry 105 receives device control signal 131, or timing signals, from the device 130. These timing signals are generally based on one of the interface signals 135, such as an external clock, but could be generated solely in the on-chip optimization circuitry. Based on the timing signals from device 130, the on-chip optimization circuitry provides modified device control signal 121, or modified device timing, to the device 130. In addition, the on-chip verification circuitry determines whether the portion of the semiconductor device 130 is functional based on the modified device control signal 121. In a preferred embodiment, the device control signal 131 provides a fixed reference for the generation of the modified device control signal 121.

Based upon the test results of verification circuit 110, the on-chip optimization circuitry 105 will further modify the device control signal 131 in a manner to determine if there is an improved modified device control signal 121, where an improved signal would be more optimal in terms of system performance. It should be noted, in semiconductor device 100, that both a device control signal 131 and a modified device control signal 121 are shown to connect the device portion 130 to the optimization circuitry 105. It would be understood by one skilled in the art, that during a non-optimized operation, the device control signal 131 would be used to provide control to the device portion 130. During optimization, the device control signal 131 is received by the on-chip optimization circuitry 105 which provides the modified device control signal 121 to control the device 130 in place of the device control signal 131. During non-optimized operation, the on-chip optimization circuitry could utilize the device control signal 131 by merely passing the device control signal 131 through to the on-chip optimization circuitry via the modified device control signal 121.

In FIG. 1, the on-chip optimization circuitry 105 further comprises chip verification circuitry 110 coupled to a delay generator 120. The delay generator 120 further includes a variable delayed controller 125. In this embodiment, the chip verification circuitry 110 provides the circuitry necessary to implement and monitor testing of the portion of the semiconductor device 130, while the delay generator 120 modifies the device control signal 131 to produce the modified device control signal 121. The delay generator 120 will be discussed in more detail with reference to FIG. 2.

In operation, when determining an optimal performance point for semiconductor device 100, the chip verification circuitry 110 provides a delay value to the delay generator 120. In turn, the device control signal 131 is received and a modified by the delay generator 120 to provide a modified device control signal 121. This modified device control signal 121 in turn is provided to the portion of semiconductor device 130. In parallel, the chip verification circuitry monitors device signals 132 from the portion of semiconductor device 130. Based on the device signals 132, the chip verification circuitry 110 determines whether or not the modified device control signal 121 produces a valid response from the portion of semiconductor device 130. Where a valid response is received, the portion of semiconductor device 130 is determined to be functional.

In another embodiment, where the chip verification circuitry also includes control circuitry, the chip verification circuitry 110 receives the device control signal 131 represents a plurality of device control signal 131. Each device control signal 131 can be modified by the delay generator 120 to provide more than one modified device control signal 121. This allows the chip verification circuitry 110 to specify specific timing relationships between control signals in order to determine an optimal performance point.

It would be understood by one skilled in the art, that the optimal performance point varies from semiconductor device to semiconductor device. In addition, what constitutes an "optimal" performance can vary by user. For example, one user may wish to optimize a first signal at the expense of a second. Conversely, another user may wish to optimize the second signal at the expense of the first. Yet another optimization may trade speed for power.

In accordance with the present invention, the chip verification circuitry 110 may contain built-in self test (BIST) circuitry. BIST circuitry is known in the art and is integrated on-chip for a specific device. BIST performs a self test operation for the specific the device. However, BIST circuitry does not have the ability determine an optimal operation point for semiconductor devices. Therefore, the additional circuitry needed to achieve optimal performance timing for a device is minimal when BIST previously exists.

Figure 2:
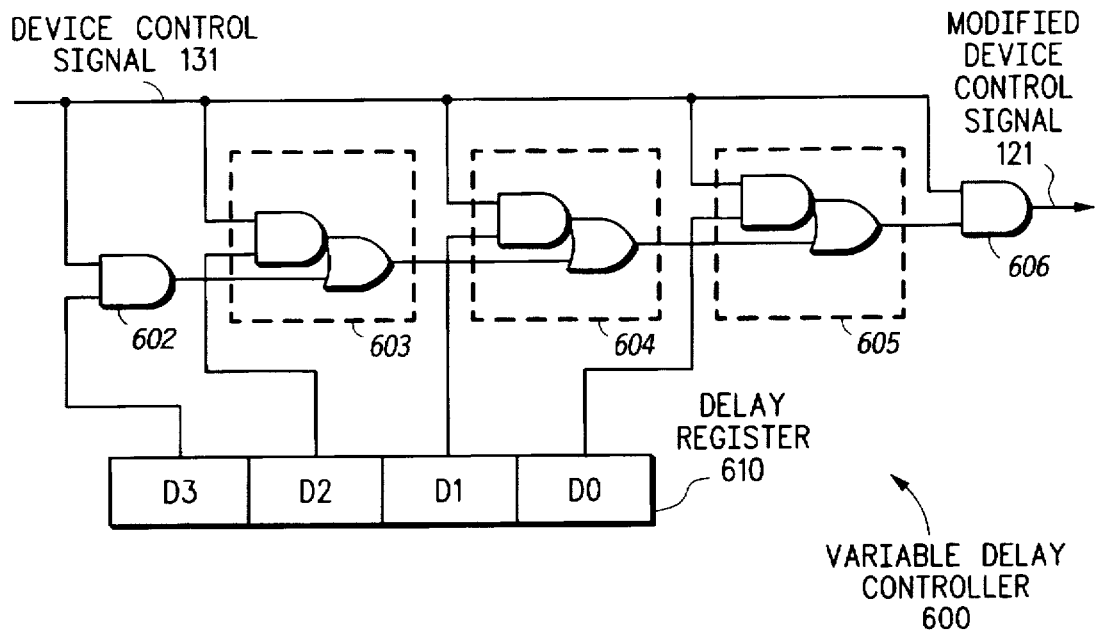
FIG. 2 illustrates, in block and logic diagram form, a delay generator in accordance with the present invention.

FIG. 2 illustrates one embodiment of a circuit 600 implementing the variable delay controller 125 of the delay generator 120 of FIG. 1. The delayed generator 600 comprises AND gates 602 and 606, AND/OR gate combinations 603, 604, and 605, and a delay register 610. AND gates 602 and 606 each having a first input, a second input, and an output. AND/OR gate combinations 603, 604, and 605 each having a first AND input, a second AND input, an AND output, a first OR input coupled to the AND output, a second OR input, and an OR output. The output of AND 602 is connected to the second OR input of 603. The OR output of 603 is connected to the second OR input of 604. The OR output of 604 is connected to the second OR input of 605. The OR output of 605 is connected to the second input of AND 606. A device control signal 131 is received by a first input of AND 602 and 606, and the first AND input of AND/OR combinations 603, 604, and 605.

Each of the four logic elements 602, 603, 604 and 605, have a corresponding location in the delay register 610. The second input of AND 602 is connected to receive the bit value of bit D3 of delay register 610. The second AND input of 603 is connected to receive the bit value of bit D2 of delay register 610. The second AND input of 604 is connected to receive the bit value of bit D1 of delay register 610. A second input of the and gate of 605 is connected to the bit D0 of the delay register 610. It is understood that a four bit control register is used for purposes of example, and that any number of bits could be implemented. It should further be noted that for the embodiment shown, the delay generator has no other circuitry than the variable delay controller 600. Other embodiments of the invention would allow various functions, such as interface circuitry, to be included in the delay generator 120.

Figure 3:
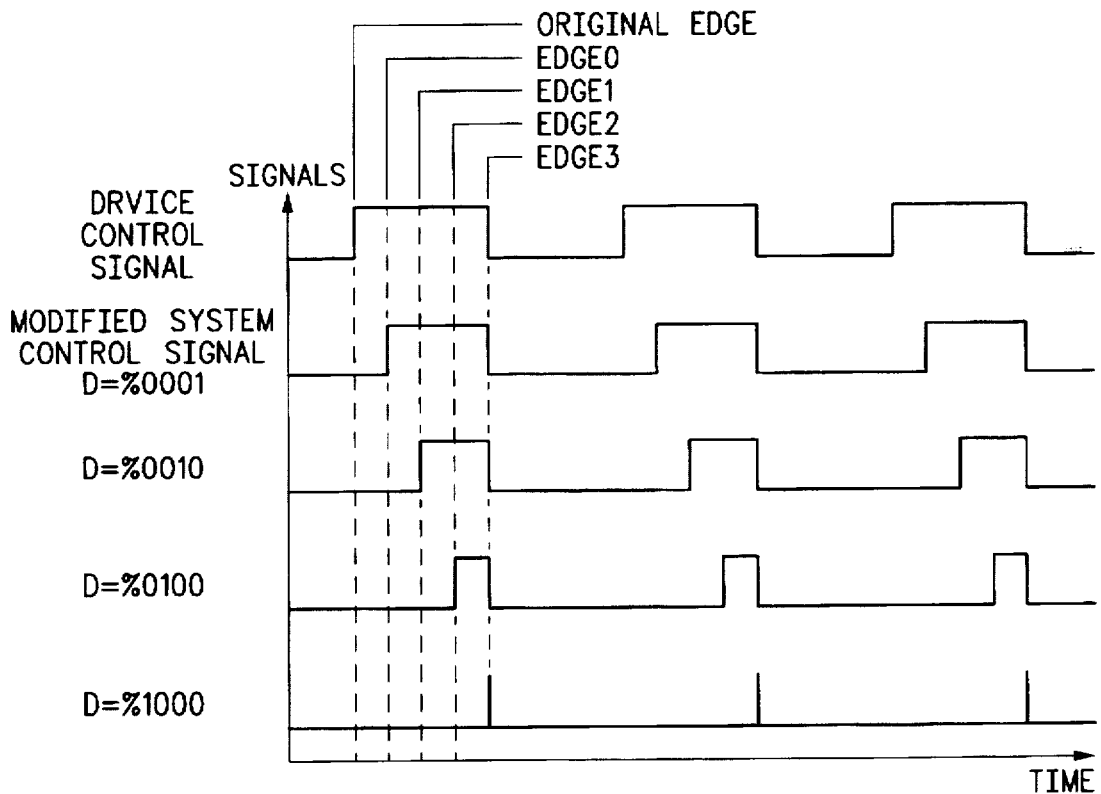
FIG. 3 illustrates, in wave diagram form, a relationship among signal waveforms of the delay generator of FIG. 2.

In this embodiment, the chip verification circuitry 110 writes a value to the delay register 610. This delay register value is used to control the timing of the rising edge of the device control signal 131. This, in effect, decreases the positive pulse of the device control signal 131 as illustrated in FIG. 3. In other embodiments, the delay register could be updated automatically based on an increment or change signal (not shown). In such an embodiment, an algorithm would be used to write the next value. Such an algorithm could be as simple as shifting a bit value through the delay register 610.

In FIG. 3 illustrates a series of waveforms highlighting the operation of the variable delay controller 600 the device control signal 131 is shown to have a original rising edge. When the delay register 610 has a binary value of %0000 (where % represents a binary number), the variable delay controller 600 produces a modified device control signal 121 having no pulses. This occurs because each of the logic elements 602–605 provide logic level zeros at their outputs given a register value of zero. As a result, AND 606 receives a logic level zero at its second input, causing a logic level zero at its output. In normal operation, the value %0000 would not be used. Therefore, in order to provide a minimum delay, register value needs to be %0001. This is illustrated in the modified device control signal 121 of FIG. 3 where the delay register value (D)=%0001.

When D=%0001, the bit D0 of the delay register 610 of FIG. 2 provides a one to the first AND input of AND/OR combination 605. The AND portion of 605 provides a logic level zero to its OR portion as long as a logic level zero is received on its first input from the device control signal 131. As discussed above, since bits D1, D2 and D3 are all zero, the logic elements 602–604 provide logic level zeros at their outputs, causing the second input of NOR portion 605 to receive a logic level zero. When the device control signal 131 transitions to a logic level high, the AND portion 605 will produce a logic level high output. In turn, the OR portion 605 will transition to a logic level high, which is received by the second input of AND 606. At substantially the same time, the first input to AND 606 receives the logic level high from the device control signal 131. This, in effect, produces the modified device control signal 121 at the output of NAND gate 606.

Assuming the delay portions through the NAND gate 606 are negligible, and the delay through 605 is finite, the original edge of the device control signal 131 is shifted to location EDGE0. The differences between EDGE0 and the original edge represents a finite amount of time which represent the delay through the logic portion 605. In a likewise manner, when the value of delay register 610= %0010, the logic portion 604 will generate an active edge having two finite delays, one from AND/OR 605, which providing a logic one to the second input of OR portion 605 which provides the second finite delay. Note the effects of delay value of %0010 is that two finite delay values are recognized. Therefore, as represented in FIG. 3, a delay value of %0010 produces a rising edge represented as EDGE1 which produces a smaller device control signal 131 pulse.

Likewise, the delay value %0100 will produce yet a shorter pulse, while for a value of %1000, in the embodiment shown, merely a spike is produced. The spike represents the situation where the rising edge has moved to the same location as the falling edge. This will cause indeterminate results, and is not desirable during normal operation, as the signal represented by a spike in that the signal may or may not actually exist.

The examples of FIG. 2 and FIG. 3 are but one embodiment in accordance with the present invention. The embodiment shown requires that a single bit of the delay register 610 be represented by an active one state. In the illustrated embodiment, where multiple bits of the delay register 610 contain active one states, only the least significant bit, or right-most bit, controls. For example, the values %0001, %0011, %1111 all produce the same delay. However, for the example shown in FIG. 2, the value %0001 has the lowest power consumption, as there are no extra logic portions transitioning.

It is understood that a scheme could be written such that the delay register could contain any value, such as %0011, and a decoder provide the appropriate information to the logic portions 602, 603, 604, and 605, for example %0100. In addition, it is understood that delay generator 600 could be designed to effect the falling edge relative to the rising edge. In another embodiment, a delay generator 600 could be designed that allowed movement of either or both the rising edge and the falling edge independent of each other. In yet another embodiment, it is understood that a delay register 600 could use phase locked-loop techniques, where the value in the delay register 610 represents an desired frequency or phase relationship to device control signal 131. In yet another embodiment, it is understood that a combination of these possible delayed generators could be used. In yet another embodiment, it is understood that device control signal 131 portion besides delay could be changed, for example, a signal voltage swing, or rise and fall times could also be modified by the delay generator 600.

In the embodiment shown the device control signal 131 acts a reference for the generation of modified device control signal 121. As such, the rising and falling edges of signal 131 control the generation of signal 121. For example, the falling edge of signal 121 relates to the falling edge of signal 131, while the rising edge of signal 121 relates to the rising edge of signal 131 and a delay value. Normally, the pulse width of signal 131 is loner than the maximum delay value modifier. This assures generation of a pulse. Where the delay is equal to the pulse width of signal 131 an undesirable spike could be generated. Where the delay value is greater that the pulse width of 131, it will be desirable to maintain a low signal.

Figure 4:
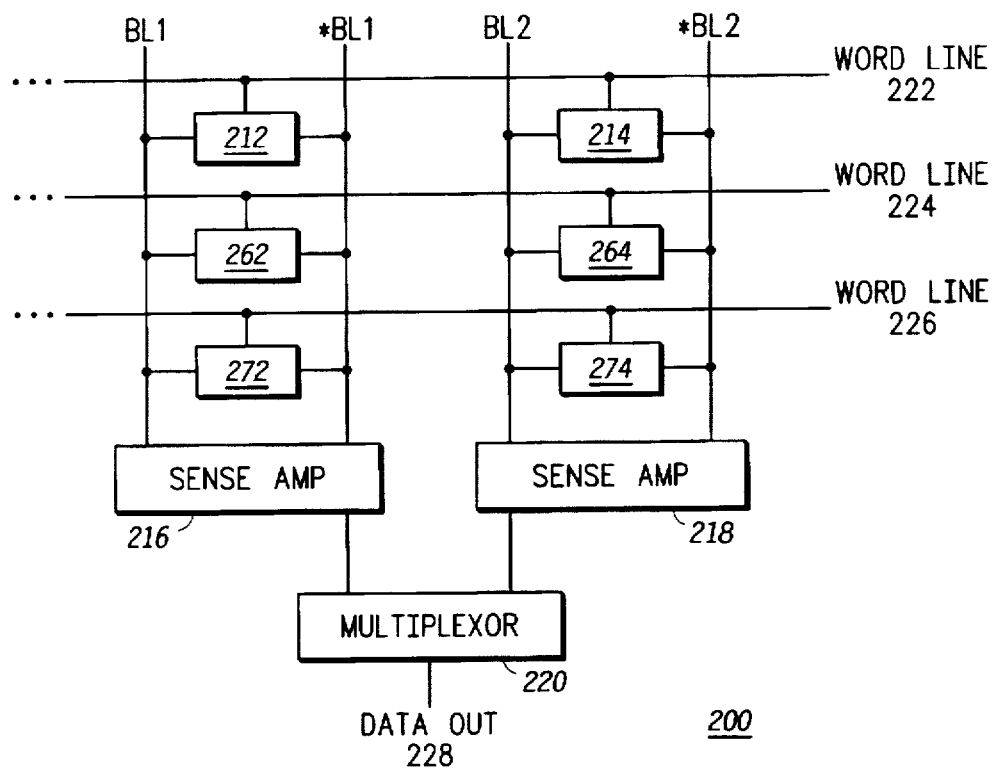
FIG. 4 illustrates, in block diagram form, a portion of a memory device 200.

FIG. 4 illustrates a portion of a device 200, and is a specific implementation of semiconductor device 130 of FIG. 1. The portion of device 200 represents a portion of a memory device used for further example of the present invention. The device 200 comprises bit cells 212, 214, 262, 264, 272, and 274, sense amplifiers 216 and 218, and multiplexor 220.

The bit cells 212, 262, and 272 are connected to a first bit line labeled BL1, and a second labeled *BL1 (Note that a signal having a "*" prefix represents the inverse of a signal with the same name). Bit cells 214, 264, and 274 are connected to a second bit line labeled BL2, and a second bit line inverted labeled *BL2. The bit cells 212 and 214 are coupled to a word line 222. Bit cells 262 and 264 are coupled to a word line 224. Bit cells 272 and 274 are coupled to a word line 226. Sense amplifier 216 is coupled to receive BL1 and *BL1. Sense amplifier 218 is coupled to receive BL2 and *BL2, multiplexor 220 is coupled to receive an output signal from sense amp 216, an output signal from sense amp 218, and produces a signal labeled data out 228.

For illustration purposes, the memory 200 drives the bit line from a low potential to Vdd, though it is understood that the memory could operate in the opposite fashion. In operation, during a read cycle, each of the bit cells 212, 214, 262, 264, 272, 274 contain a charge representing a single bit of information which in turn represent either a logic high value or a logic low value. Word line 222 would be asserted to read bit cell 214. The asserted word line 222 would be sensed by the bit cells 212 and 214, causing each of the bit cells to drive the bit line and bit line bar lines based on its stored charge. Therefore, to indicate a given logic level, bit cell 214 will attempt to charge BL1 while discharging *BL1, or conversely to indicate the opposite logic level, bit cell 214 will charge *BL1 while discharging BL1. Simultaneously, while bit cell 214 is charging/discharging its bit lines, bit cell 212 drives its bit lines BL2 and *BL2 based on its stored charge.

It is understood that the logic level high and the logic level low states driven to the bit lines by the bit cell 214 may vary from device to device, and that the key feature is that the bit line and the bit line bar are driven in such a manner that there is a detectable difference between them. It is this detectable difference that the senses amplifier 218 detects to determine the actual logic level.

As a result of the bit lines being charged, sense amplifiers 216 and 218 will determine the logic level state at which bit cells 212 and 214 are respectively in. These logic level values are presented to the multiplexor 220. Circuitry not shown will determine whether the multiplexor output reflects the value stored in bit cell 212 or 214.

Figure 5:
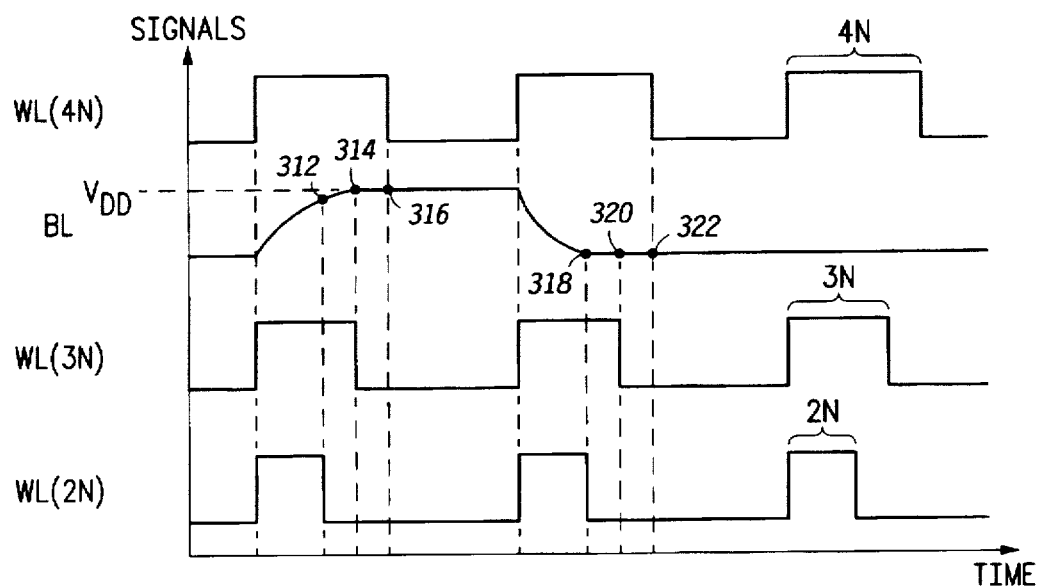
FIG. 5 illustrates, in wave diagram form, a relationship among signal waveforms of the device 200 of FIG. 4.

FIG. 5 represents a timing diagram further detailing the operations of the memory circuit 200. A first waveform illustrates a word line signal (WL) producing a pulse having a width of 4N, where N is some arbitrary time value. When the word line signal goes active, high in FIG. 5, a representative bit line is shown being charged, in a second waveform labeled BL. This represents a bit cell such as bit cell 212 charging BL1 or *BL1. Likewise, the representative bit line is shown to have fully charged at a point 314 which is prior to the falling edge of the positive pulse of the word line. This falling edge is represented at point 316 on the bit line signal. The timing representations of FIG. 5 are for illustration purposes and not meant to limit the present invention. It is understood that it is common for memory bit lines to not fully charge or discharge as represented in FIG. 5.

Similarly, the bit line is shown to be fully discharged following a subsequent rising edge of WL. BL is shown to be completely discharged at point 318 which is well before a falling edge of a second positive pulse of the word line. Note, as illustrated, that relative to the rising edges of their respective pulses, that BL charges in 3N time units, while BL fully discharges in 2N time units.

In the example shown, the fully charged point occurs 1N time units prior to the end of the active pulse. Referring back to FIG. 1, assuming that the word line having a pulse of 4N were the device control signal 131, the chip verification circuitry 110 could indicate to the delay generator 120 to provide a delay such that a modified device control signal 121 having a pulse of 3N be received by the portion 130, or memory portion 200 in the example. Note that in this embodiment, it is the falling edge that has moved as opposed to the rising edge as shown in of the example of FIG. 2 and FIG. 3.

With a word line having a positive pulse value of 3N time units it can be seen that the bit line continues to be fully charged at point 314 by the time of the falling edge. In addition, at a point 320 on the falling edge relative to the second clock pulse of the word line, the bit line is fully discharged. As a result, the functionality of the memory portion 200 should be determined functional by the chip verification circuitry 110 of FIG. 1.

Next, a word line having a positive pulse of 2N, as produced by the delay generator 120 is shown. As such, it is illustrated that when the falling edge of the word line occurs at point 312 the bit line is not yet fully charged. This may or may not effect functionality depending on the device characteristics and specification. If a fully charged bit line is needed, the word line with a width of 2N would cause a device failure. Referring back to FIG. 1, if the on-chip optimization circuitry 105 changed the delay values to the point where the word line represented by a device control signal 131 were reduced to a positive width of 2N time units the on-chip verification circuitry 110 would detect a failure and would thereby know that it had surpassed the optimization level for reducing the pulse width.

Generally, it is possible for the sense amplifiers of FIG. 4 to detect a partially charged bit line. As such, it may not be necessary to fully charge the bit lines. In this situation, a pulse having a width of 2 time units would be appropriate, and by not allowing the bit lines to fully charge additional power savings occur. For example, if the charge value at point 312 is 10% below the fully charged value at point 316, power savings of up to 10% could be obtained given the fact that millions of bit line charges occur every second.

It is illustrated with respect to waveform WL(3N) of FIG. 5, that the bit line is fully discharged after two time units and therefore, would not cause device performance issues. The timing diagrams of FIG. 5 illustrate how a memory device portion 200 of FIG. 4 could be optimized by moving clock edges to determine an optimal performance. (In this situation optimal performance is defined as the shortest possible pulse which allows functional operation). In this example, it was further illustrated how a given pulse width can also reduce power consumption where the bit line is not required to be fully charged. It should also be noted that as the pulse width is reduced, it would also be feasible for the overall clock rate to be increased allowing for more accesses in a given period of time, hence allowing for further optimized device performance at the device level, as well as at a system level, such as with a modern desk top computer.

While the discussion with respect to the memory portion 200 has focused on the bit line timing of FIG. 5, it is also understood that the present invention could turn the sense amplifier on at an optimal time, as well as shut it off after the bit level is detected. This would allow increased power savings.

Figure 6:
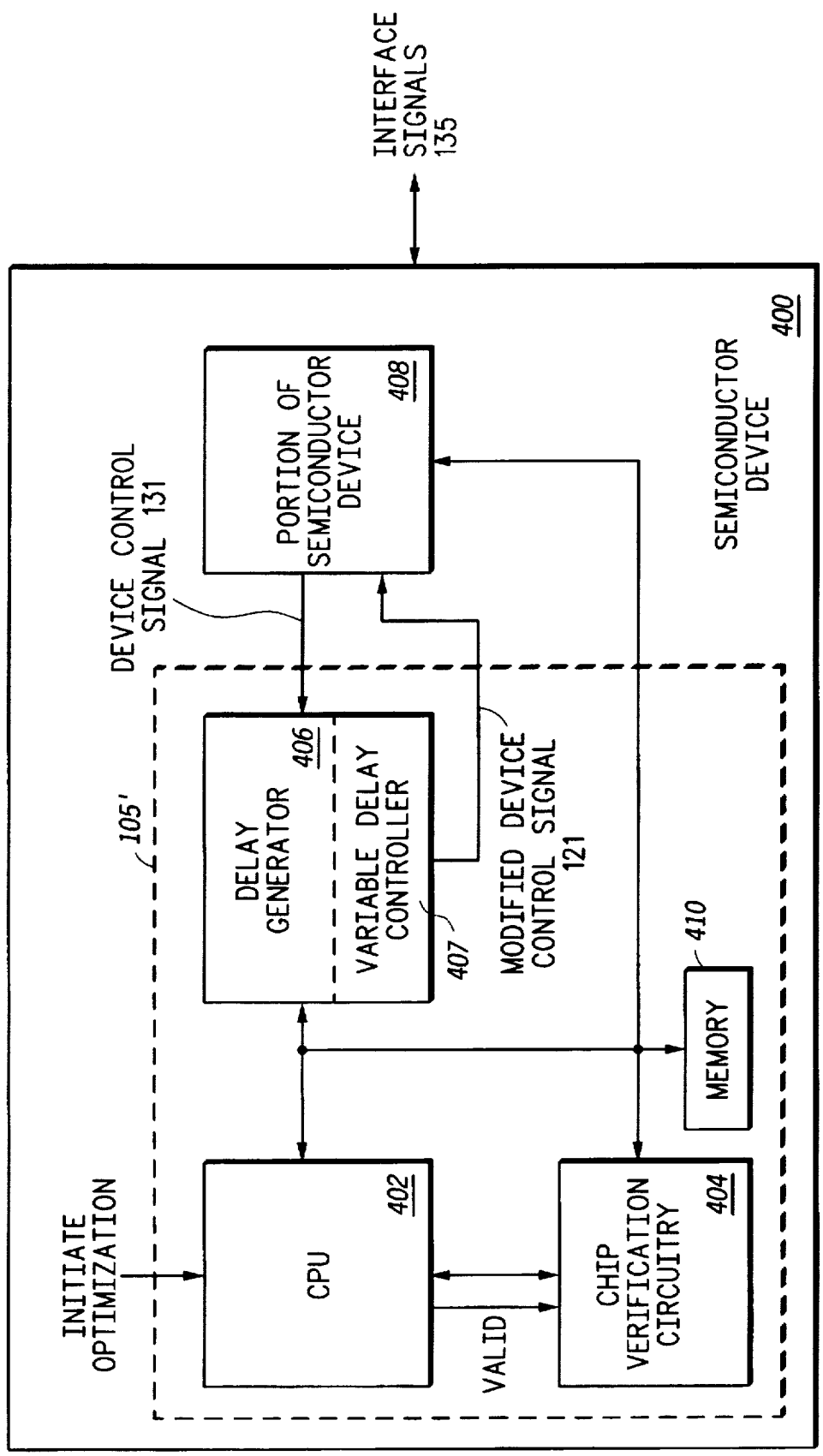
FIG. 6 illustrates, in block diagram form, a device 400 in accordance with the present invention.

FIG. 6 illustrates a semiconductor device 400 in accordance with the present invention. Semiconductor device 400 comprises a portion of semiconductor device 408, and a chip optimization circuitry 105'. The chip optimization circuitry 105' comprises a CPU 402, a chip verification circuitry 404, a delay generator 406, and a memory 410. The CPU 402 receives an INITIATE OPTIMIZATION SIGNAL, and is couple to the delay generator 406, the chip verification circuitry 404 including the reception of a valid signal. The chip verification circuitry 404 is coupled to the portion of the semiconductor device 408. Memory 410 is coupled to the CPU 402, and the delay generator 406. The delay generator 406 receives a device control signal 131 from the portion of semiconductor device 408, and is coupled to provide a modified device control signal 121 to the portion of semiconductor device 408. The semiconductor device 400 further is coupled to receive INTERFACE SIGNALS externally.

The portion 408 is analogous to the portion 130 of FIG. 1, the delay generator 406 is analogous to the delay generator 120 of FIG. 1. While the chip verification circuitry of 110 of FIG. 1 performs the verification in its entirety, the embodiment of FIG. 6 implements the chip verification function in concert with the CPU 402, and memory 410. As such, CPU 402 can determine the effects of timing changes upon the chip. In one embodiment of the present invention, the CPU 402 could perform all chip verification functions provided by chip verification circuitry 110 of FIG. 1. In such a configuration, the CPU would write a delay value into a location of memory 410. Memory 410 can be volatile or non volatile memory. The delay generator 406 accesses this location and provides a modified device control signal 121 as discussed previously. The results from CPU 402 and on-chip verification circuitry 404, can be used to determine how to optimize device timing.

Figure 7:
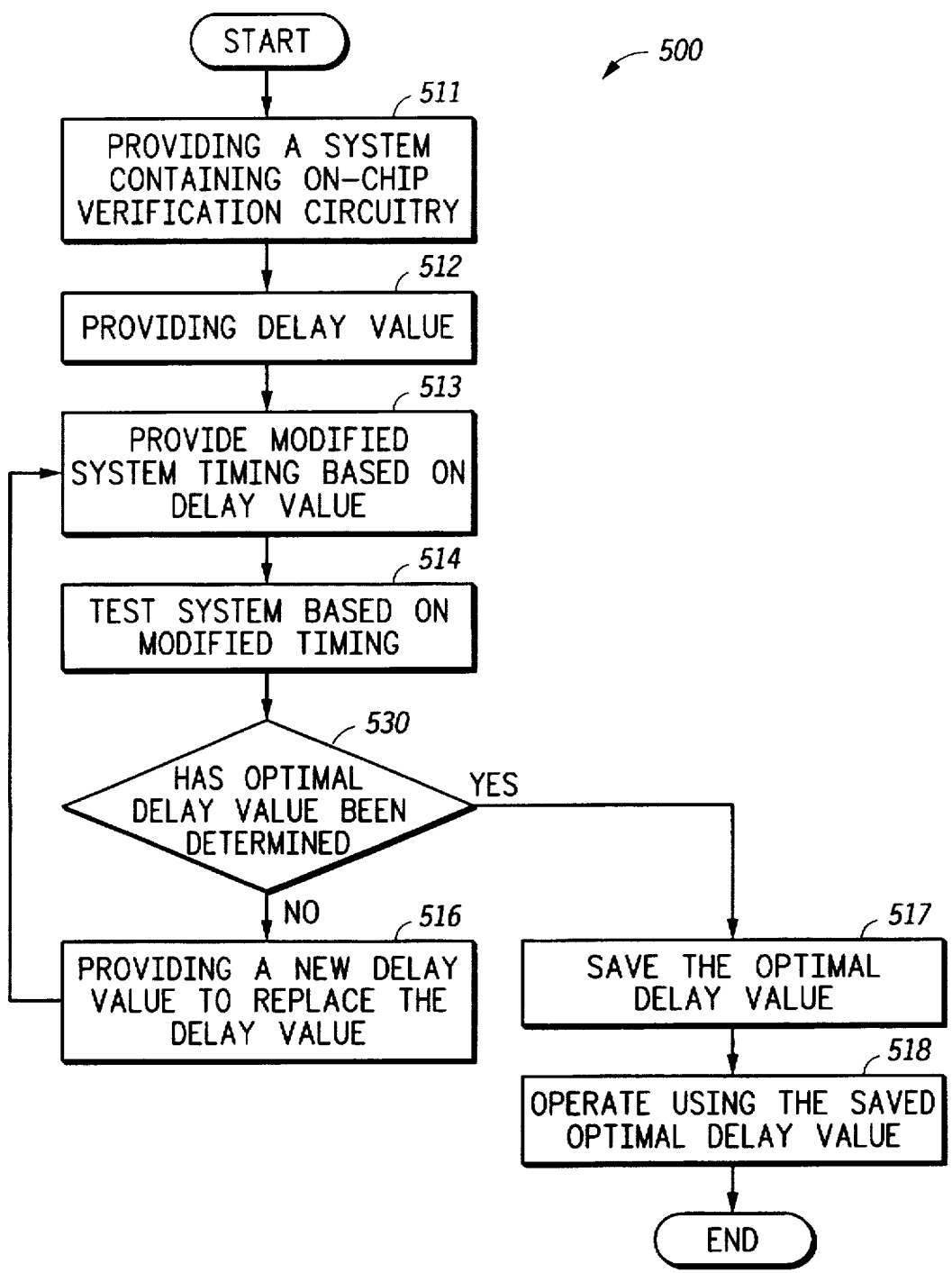
FIG. 7 illustrates, in flow diagram form, a method 500 in accordance with the present invention.

FIG. 7 illustrates a method 500 in accordance with the present invention. Beginning at a step 511, a device, such as that of FIG. 1, or 6, is provided containing on-chip verification circuitry. Next, at a step 512 a delay value is provided. Note that the delay value is provided by a user or generated by an on-chip control circuitry (not shown). In a preferred embodiment, the on-chip control circuitry would be part of the delay generator 120, or a separate control block (not shown). While the control function could reside within the chip verification circuitry 110, this would require modification to a portion of verification circuitry that may have previously existed and have a separate use, such as with BIST circuitry. The delay value of the flow illustrated is a starting point for determining optimal device performance. Next, at step 513, a modified device timing is provided based on the delay value. This modified device timing would be analogous to the timing of FIG. 3. Next, a step 514, the device is tested using the on-chip verification circuitry based upon the modified timing.

Next, at the step 530, a determination is made whether or not an optimal delay value has been determined. As discussed previously the optimal delay value is going to be device dependent, and is determined and provided by a user. An example of how an optimal delay value may be specified would be that the optimal timing produces the smallest pulse width between two edges. Once it is determined an optimal delay value has not been determined, flow proceeds to step 516 where a new delay value replaces the delay value of step 513. Flow then proceeds to step 513 and a loop which includes steps 513, 514, 530 and 516 is formed. This loop helps determine when an optimal delay value has been met. When an optimal delay value at step 530 is determined to have been found, flow proceeds at a step 517. At step 517, the optimal delay value is saved. As discussed previously, this delay value can be saved in volatile or non-volatile memory. When stored in non-volatile memory the value can be stored for future use, which can eliminate the need to repeat flow 500 upon power-up. Conversely, where volatile memory is used the value is available for the remainder of the device's power cycle. Note that at step 517 it may be necessary to produce an optimal value based on current value, this is generally accomplished without further functional verification. Next, at a step 518, the device is operated using the saved optimal delay value.

It would be understood by one skilled in the art that the modified system timing provided at step 513 could initially be the least aggressive, value that is subsequently improved until the system fails. Note the most aggressive value is the value most likely to cause a device failure. This would assure the optimal value being identified. Similarly, the initial modified timing could be a most aggressive value that is subsequently degraded until the system passes. Yet another implementation could iteratively determine the optimal location by increasing and decreasing the delay value such that the modified timing would "bounce" on either side of the optimal value until it is identified. It is recognized that other implementations of identifying the optimal timing exist, and that the present invention is not meant to be limited by the specific examples presented.

Figure 8:
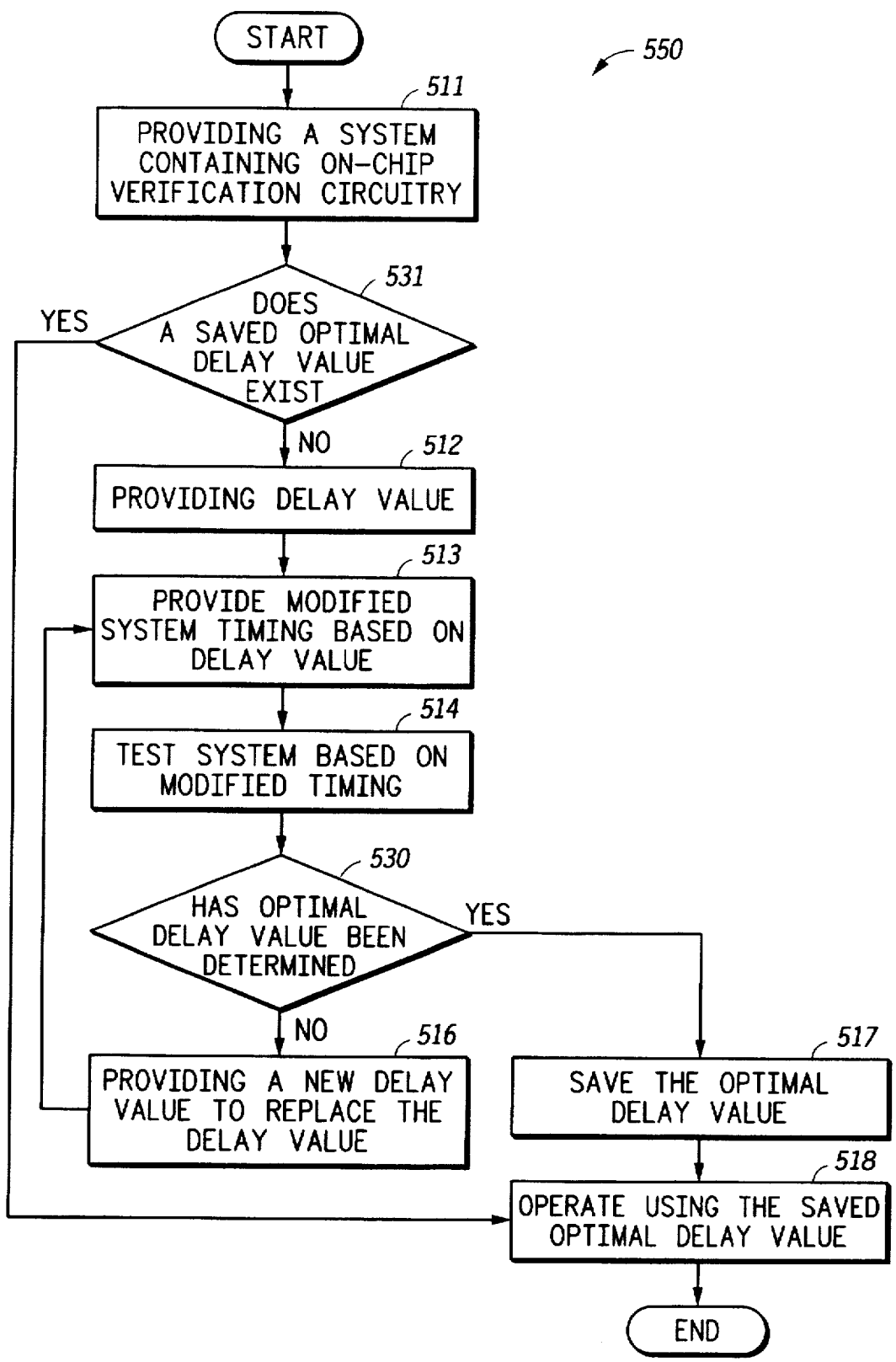
FIG. 8 illustrates, in flow diagram form, a method 550 in accordance with the present invention.

FIG. 8 illustrates a method 550 in accordance with the present invention. The method 550 is similar to the method 500 except where indicated. In method 550 following the step 511, a step 531 is inserted which makes a determination whether a saved optimal delay value exists. When true, flow proceeds to the end of the flow at step 518, where operation continues using this value. When false, flow proceeds to step 512 as discussed above with reference to FIG. 7.

It should now be apparent, that by using on-chip verification circuitry, device timing can be optimized, therefore, eliminating the need to depend upon specification using wide operating margins. By providing optimized device timing, systems using the device can in turn be optimized. These systems can be designed around the optimized parts, or they can be designed to self-configure in such a manner the optimization information of the individual components specifies how the overall system is configured. For example, base on device configuration, the system may determine the maximum clock rate to assure system functionality. The system could be further defined to periodically re-optimize the devices and the system to assure operating condition changes do not cause failures or substandard performance. In addition, the present invention could be used to perform speed sorting automatically with minimal tester intervention. This would reduce tester time where speed sorting is desirable in that the tester would need only to read the delay register 610 to determine the optimal speed.

For devices currently using BIST, the present invention adds minimal overhead, as the BIST functions can be used to determine device failures. Therefore, minimal device costs can be realized, while maximizing performance.

While the present invention has been illustrated and described with reference to specific embodiments, further modifications and improvements will occur to those skilled in the art. For example, the delay generator 600 of FIG. 2 is described to have a common finite delay value for each stage 602 through 605, in practice, it would be possible to design each stage to have a different delay if desirable. Further, it is understood that the present invention is not limited to a single definition of optimization, or means of determining when optimization is achieved. For example, a maximum delay value could first be used and subsequently reduced until a failure occurs, or the delay value could be varied longer and shorter to determine an optimal performance delay. As a further example, while the chip verification circuitry 110 is described as providing control functions such as the delay value to the delay generator 120, it would be understood that this control function could be maintained in the delay generator block 120, or a separate control block of the on-chip optimization circuitry 105. Therefore, it is to be understood, that this invention is not limited to the particular forms illustrated herein and that the appended claims cover all modifications that do not depart from the scope and spirit of this invention.

I claim:

1. A method for optimizing timing of an integrated circuit device, the method comprising the steps of:

(a) receiving a control delay value;

(b) producing a modified device timing, based on the control delay value;

(c) testing the modified device timing by using on-chip verification circuitry to determine if the integrated circuit device is a functional device;

(d) receiving a new control delay value, where the new control delay value replaces the control delay value and is different from the control delay value; and (e) repeating steps (b)–(e) to determine an optimal control delay value for the integrated circuit device.

2. The method of claim 1 further comprising the step:

(f) saving the optimal control delay value.

3. The method of claim 2 further comprises the steps of:

(g) determining if a saved optimal delay value has been saved for the integrated circuit device, wherein if the saved optimal delay value does exist, using it as the control delay value, and where the saved optimal delay value does not exist performing the steps (b)–(e).

4. The method of claim 1 further wherein the modified device timing is produced by delaying an active edge of a device control signal based on the control delay value.

5. The method of claim 4 wherein step (b) further comprises delaying an active edge of a plurality of device control signals by the control delay value.

6. The method of claim 5 wherein the control delay value comprises a plurality of control delay values.

7. The method of claim 1 wherein the on-chip verification circuitry comprises Built-In Self Test (BIST) features.

8. A method for controlling timing of a device using verification circuitry within the device to verify device functionality, where the device has a control signal having an active edge, the active edge having an active edge location relative to a device clock, the method comprising:

(a) modifying the active edge location of the control signal;

(b) testing the device for functionality by using the verification circuitry within the device to determine if the device produces a valid result, where the valid result is indicative of the device operating in a predefined manner;

(c) repeating steps (a) through (c) until the active edge producing a valid result meets a predefined requirement; and (d) storing the active edge location.

9. The method of claim 8 wherein the predefined requirement is the active edge nearest a device clock edge.

10. The method of claim 8 wherein the predefined requirement is the active edge furthest from a device clock edge.

11. A method for optimizing timing of a device, using circuitry within the device used to verify device functionality (verification circuitry), where the verification circuitry generates a valid signal if the device meets a predefined device criteria, the method comprising the steps of:

(a) setting a delay value of a variable delay controller to a maximum delay value, where the maximum delay value is a longest possible delay that can be represented by the variable delay controller;

(b) producing a modified device timing, using the variable delay controller by delaying an active edge of a device control signal by the delay value;

(c) testing the modified device timing by using the verification circuitry to determine if the device is functional, where the device is functional if the valid signal is generated;

(d) decreasing the delay value to produce a new delay value, where the new delay value replaces the delay value and is different from the delay value, and repeating steps (b)–(d) until the valid signal indicates that the device is not functioning; and (f) increasing the delay value to establish an optimal delay value.

12. The method of claim 11 wherein the method further comprises the step of:

(g) storing the optimal delay value as a stored delay value.

13. The method of claim 12 wherein the method further comprises the step of:

(h) operating the device using the optimal delay value.

14. The method of claim 12 wherein the method further comprises the step of:

(h) determining if a stored delay value exist, and operating the device using the optimal delay value if the delay value does exist, and performing steps (b)–(d) if the delay value does not exist.

15. A method for optimizing timing of a device, using circuitry within the device used to verify device functionality (verification circuitry), where the verification circuitry generates a valid signal if the device meets a predefined device criteria, the method comprising the steps of:

(a) setting a delay value of a variable delay controller to a minimum delay value, where the minimum delay value is a shortest possible delay that can be represented by the variable delay controller;

(b) producing a modified device timing, using the variable delay controller by delaying an active edge of a device control signal by the delay value;

(c) testing the modified device timing by using the verification circuitry to determine if the device is functional, where the device is functional if the valid signal is generated;

(d) increasing the delay value to produce a new delay value, where the new delay value replaces the delay value and is different from the delay value, and repeating steps (b)–(d) until the valid signal indicates that the device is not functioning; and (f) decreasing the delay value to establish an optimal delay value.

16. A method for optimizing timing of a device, using circuitry within the device used to verify device functionality (verification circuitry), where the verification circuitry generates a valid signal if the device meets a predefined device criteria, the method comprising the steps of:

(a) setting a delay value of a variable delay controller to a first delay value, where the first delay value is different than a predefined best delay value that can be represented by the variable delay controller;

(b) producing a modified device timing, using the variable delay controller by delaying an active edge of a device control signal by the delay value;

(c) testing the modified device timing by using the verification circuitry to determine if the device is functional, where the device is functional if the valid signal is generated; and (d) modifying the delay value to produce a new delay value, where the new delay value replaces the delay value and is different from the delay value, and repeating steps (b)–(d) until the valid signal indicates that the device is not functioning.

17. A method for optimizing timing of a plurality of signals of a device using a Built-In Self Test (BIST) feature, where the BIST feature generates a valid signal if the device is functional, the method comprising the steps of:

(a) setting a plurality of variable delay controllers to a known delay value;

(b) setting a first variable delay controller of the plurality of variable delay controllers to a first delay value, where the first delay value is different than the known delay value;

(c) producing a modified device timing by using the first variable delay controller to modify at least one active edge of a device control signal by the first delay value;

(d) testing the modified device timing by using the BIST feature to determine if the device is functional, where the device is functional if the BIST feature generates the valid signal;

(e) setting the first variable delay controller to have a new delay value, where the new delay value replaces the first delay value and is different than the first delay value;

(f) repeating steps (b)–(e) until an optimal first delay value has been determined; and (g) storing the optimal first delay value as a stored delay value; and (h) repeating steps (a)–(h) for determining an optimal delay value for each of the plurality of variable delay controllers.

18. A method for optimizing timing of a plurality of signals of a device using a Built-In Self Test (BIST) feature, where the BIST feature generates a valid signal if the device is functional, the method comprising the steps of:

(a) setting a plurality of variable delay controllers to a known delay value;

(b) setting a first variable delay controller of the plurality of variable delay controllers to a first delay value, and a second variable delay controller of the plurality of variable delay controllers to a second delay value, where the first delay value is different than the known delay value;

(c) producing a modified device timing by using the first variable delay controller and the second variable delay controller to modify at least one active edge of device control signals based on the first delay value and the second delay value;

(d) testing the modified device timing by using the BIST feature to determine if the device is functional, where the device is functional if the BIST feature generates the valid signal;

(e) setting the first variable delay controller to have a new first delay value, and the second variable delay controller to have new second delay value, where the new first delay value replaces the first delay value and the new second delay value replaces the second delay value;

(f) repeating steps (b)–(e) until an optimal first delay value and second delay value has been determined; and (g) storing the optimal first delay value and second delay value as a stored delay value; and (h) repeating steps (a)–(h) for determining an optimal delay value for each of the plurality of variable delay controllers.

19. An apparatus for optimizing timing of a data processor device, where the apparatus comprises:

a Central Processing Unit (CPU) for executing computer instructions;

a Built-In Self Test (BIST) device, for performing BIST, coupled to the CPU and at least part of the device for determining functionality of the at least part of the data processing device, the BIST device producing a valid signal if the at least part of the device is functional;

a delay generator, having a variable delay controller, coupled the CPU and, receiving a device control signal, wherein the variable delay controller specifies a delay value to the delay generator, and wherein at least part of the device control signal is delayed by the delay generator based on the delay value of the variable delay controller to produce a modified device control signal 121; and a memory unit coupled to the CPU, the BIST device, and the delay generator, for storing the computer instructions in a memory and for storing data in the memory, the computer instructions comprising:

computer instructions for setting the variable delay controller to a delay value;

computer instructions for performing BIST to determine if the modified device control signal produces the valid signal;

computer instructions for setting the variable delay controller to have a new delay value; and computer instructions for repeating the computer instructions for performing BIST, setting the variable delay controller, and repeating, until an optimal delay value has been determined.

20. The device of claim 19 wherein the memory unit further comprising:

computer instructions for storing the optimal delay value as a stored delay value.

21. The device of claim 20 wherein the memory unit further comprising:

computer instructions for setting the variable delay controller to the stored delay value if the optimal delay value has been determined; and computer instructions for not executing remaining computer instructions of claim 20 if the stored delay value exists.

22. The device of claim 19 wherein the BIST device further comprising:

computer instructions in the memory for determining functionality of the at least part of the device and for producing the valid signal if the at least part of the device is functional.

23. The device of claim 22 wherein the BIST device further comprising:

a BIST controller coupled to receive an initiate BIST signal, the BIST controller for determining functionality of the at least part of the device and for producing the valid signal if the at least part of the device is functional, wherein upon receipt of the initiate BIST signal, the BIST controller applies a test sequence to the at least part of the device, receives test results from the at least part of the device, and compares the test results to expected test results to determine if the at least part of the device is functional.

24. The apparatus of claim 19 further comprising:

circuitry for testing at least part of the data processor device, wherein the circuitry is coupled to a plurality of portions of the data processor device;

the delay generator is coupled to the plurality of portions of the device;

the memory unit is coupled to the plurality of parts of the device, the computer instructions further comprising:

computer instruction for using the circuitry for testing the plurality of parts of the device for functionality to determine if the valid signal is generated for the modified device control signal.

25. The apparatus of claim 19 wherein the memory resides internal to the device.

26. An apparatus for optimizing timing of a device, where the apparatus comprises:

a BIST controller coupled to receive an initiate BIST signal, the BIST controller for determining functionality of at least part of the device and for producing a valid signal if the at least part of the device is functional, wherein upon receipt of the initiate BIST signal, the BIST controller applies a test sequence to the at least part of the device, receives test results from the at least part of the device, and compares the test results to expected test results in order to determine if the at least part of the device is functional; and a delay generator having a variable delay controller, the delay generator providing the initiate BIST signal, coupled to the BIST controller and to at least one device control signal, wherein the variable delay controller specifies a delay value to the delay generator, and wherein at least part of a device control signal is delayed by the delay generator based on the delay value of the variable delay controller to produce a modified device timing.

27. A method for speed sorting an integrated circuit device, the method comprising the steps of:

(a) receiving a semiconductor device to be tested;

(b) initializing a self-verification test, where in the self verification test is substantially performed by the integrated circuit device, and further comprises the steps of (c) producing a modified device timing, based on a control delay value;

(d) testing the modified device timing by using on-chip verification circuitry to determine if the integrated circuit device is a functional device;

(e) generating a new control delay value, where the new control delay value replaces the control delay value and is different from the control delay value; and (f) repeating steps (b)–(e) until an optimal control delay value for the device is determined;

(g) sorting the integrated circuit device based on the optimal control delay value.

* * * * *